(12) United States Patent
Ohmi et al.

(10) Patent No.: US 7,103,990 B2
(45) Date of Patent: Sep. 12, 2006

(54) ROTARY SILICON WAFER CLEANING APPARATUS

(75) Inventors: Tadahiro Ohmi, Sendai (JP); Yasuyuki Shirai, Sendai (JP); Takumi Fujita, Fuchu (JP); Yukio Minami, Osaka (JP); Nobukazu Ikeda, Osaka (JP); Akihiro Morimoto, Osaka (JP); Koji Kawada, Osaka (JP)

(73) Assignee: Fujikin Incorporated, Osaka (JP)

( * ) Notice: Subject to any disclaimer, the term of this patent is extended or adjusted under 35 U.S.C. 154(b) by 0 days.

(21) Appl. No.: 10/498,800

(22) PCT Filed: Sep. 11, 2003

(86) PCT No.: PCT/JP03/11667

§ 371 (c)(1),
(2), (4) Date: Jan. 21, 2005

(87) PCT Pub. No.: WO2004/036637

PCT Pub. Date: Apr. 29, 2004

(65) Prior Publication Data

US 2005/0126030 A1    Jun. 16, 2005

(30) Foreign Application Priority Data

Sep. 24, 2002    (JP) .............................. 2002-276818

(51) Int. Cl.
*F26B 5/08* (2006.01)
(52) U.S. Cl. .............................. 34/325; 34/381; 34/58; 34/80
(58) Field of Classification Search .................. 34/325, 34/330, 381, 380, 58, 80
See application file for complete search history.

(56) References Cited

U.S. PATENT DOCUMENTS 5,212,050 A  *  5/1993  Mier et al. .................. 430/320
5,985,811 A  *  11/1999  Masayuki et al. .......... 510/175

FOREIGN PATENT DOCUMENTS

EP         714120 A    5/1996
JP      2000-31109 A    1/2000

OTHER PUBLICATIONS

International Search Report, completed Dec. 16, 2003.

* cited by examiner

*Primary Examiner*—S. Gravini
(74) *Attorney, Agent, or Firm*—Griffin & Szipl, P.C.

(57) ABSTRACT

It is an object of the present invention to provide a rotation type silicon wafer cleaning device to further raise the stability of a silicon wafer by providing a better hydrogen termination on the silicon wafer after completion of chemical and pure water cleaning treatments.

According to the present invention, a rotation type silicon wafer cleaning device has a silicon wafer support/rotation driving mechanism inside the case body for cleaning the silicon wafer at the post chemical cleaning with pure water, drying and hydrogen termination treatments on the outer surface of a silicon wafer is performed by means of installing a silicon wafer drying device comprising a gas supply panel attached to a case body to supply a mixed gas of the hydrogen gas and inactive gas containing a hydrogen gas of more than 0.05%, a mixed gas supply pipe coupled to a gas mixer of the afore-mentioned gas supply panel at one end, a mixed gas heating device to heat the mixed gas in the afore-mentioned gas supply pipe, and a hydrogen radical formation apparatus equipped with a platinum coating film to form hydrogen radical at the gas contacting part where to a high temperature gas heated with the afore-mentioned mixed gas heating device touches, thus to gush out the mixed gas containing hydrogen radical formed with the afore-mentioned radical formation apparatus onto the rotating silicon wafer after cleaning is completed.

17 Claims, 8 Drawing Sheets

ROTARY SILICON WAFER CLEANING APPARATUS

This is a National Phase Application in the United States of International Patent Application No. PCT/JP03/11667 filed Sep. 11, 2003, which claims priority on Japanese Patent Application No. 2002-276818, filed Sep. 24, 2002. The entire disclosures of the above patent applications are hereby incorporated by reference.

BACKGROUND OF THE INVENTION

1. Field of the Invention

The present invention relates to a rotation type silicon wafer cleaning device to be used with semiconductor fabrication equipment and the like, and more particularly to a rotation type silicon wafer cleaning device making possible substantial quality improvements in the products by stabilizing the outer surface of the silicon wafer through the improved hydrogen treatment of the outer surface of the silicon wafer through the drying process after cleaning is completed.

2. Background of the Invention

The fabrication of semiconductor elements generally starts with a cleaning treatment of a silicon wafer, and then various treatments such as the formation of a SiO film and the like on the silicon wafer are applied after the cleaning treatment.

For cleaning treatment for silicon wafers, the so-called rotation type silicon wafer cleaning device has been broadly employed, in that a silicon wafer placed on the rotation disc installed inside the device body is rotated at high speed (approximately 2000 RPM), and chemical cleaning agents such as hydrofluoric acid and the like are dispersed thereon. After the acid cleaning treatment, a cleaning treatment with pure water is added, and lastly the silicon wafer is dried while rotating at the high speed.

On the outer surface of a silicon wafer treated for cleaning with the afore-mentioned conventional rotation type silicon wafer cleaning device, Si on the so-called surface layer is exposed and hydrogen atoms are bonded with the exposed Si atoms, thus putting the outer surface in a condition wherein the so-called hydrogen termination treatment has been performed. The aim is to obtain a highly stable cleaned surface without impure atoms and the like deposited directly onto Si. As the result, it has been said that there will not occur the so-called natural oxidation on the surface layer even when it is left in the air over a long period of time.

However, even with a silicon wafer treated for cleaning with this kind of rotation type silicon wafer cleaning device, it is observed that an oxide film is naturally formed on the outer surface with the lapse of time after a cleaning is performed. This makes it difficult to prevent the natural formation of the afore-mentioned oxide film no matter how well environmental conditions are presented for the maintenance of the wafer.

SUMMARY OF THE INVENTION

Object of the Invention

It is an object of the present invention to provide a rotation type silicon wafer cleaning device to overcome the afore-mentioned difficulties with this kind of conventional rotation type silicon wafer cleaning device, that is, when the natural formation of an oxide film is made on the outer surface of an wafer with a lapse of time, the formation can not be effectively prevent or delayed. Enhanced stabilization of the outer surface after a cleaning treatment is performed by means of providing the conventional rotation type wafer cleaning device with a novel wafer drying device.

Disclosure of the Invention

Previously, with the conventional rotation type silicon wafer cleaning device, it was assumed that hydrogen atoms were bonded with Si atoms on the exposed wafer through the drying process, thus ensuring stability of the silicon wafer after a cleaning treatment by achieving the so-called hydrogen termination on all the Si atoms on the outer surface of the wafer.

However, inventors of the present invention have discerned that either the incomplete treatment of the hydrogen termination of Si on the afore-mentioned outer surface or the partial mottle of the hydrogen termination would cause relatively low stability of the outer surface of the wafer treated with the conventional rotation type wafer cleaning device, and reached an idea that long-term stability of Si on the outer surface is enhanced by means that the hydrogen termination treatment of Si on the outer surface of the wafer after pure water cleaning is performed in an atmosphere of inert gas(es) (such as $N_2$) unreactive to hydrogen, including radicalized hydrogen, thus increasing bonding of Si atoms with H atoms, and the number of uncombined Si atoms and the number of Silicon atoms bonded with fluorine atoms are reduced significantly. At the same time, a rotation type silicon wafer cleaning device has been developed to embody the said idea, and a number of stabilization tests have been conducted on the wafers cleaned and dried with the device.

The present invention has been a creation based on the afore-mentioned ideas and tests.

A first preferred embodiment of the invention is a rotation type silicon wafer cleaning device to conduct drying and hydrogen termination treatments on the outer surface of the silicon wafer 4 in the manner that with provided with a wafer support/rotation driving device 3 inside a case body 2 to clean the silicon wafer with pure water after chemical cleaning, a silicon wafer drying device comprising a gas supply panel 5 attached to the case body 2 to supply a mixed gas of a hydrogen gas containing the hydrogen gas with more than 0.05 Vol % and an inactive gas, a mixed gas supply pipe A which one end is coupled with a gas mixer 14 of the afore-mentioned gas supply panel 5, a mixed gas heating device B to heat the mixed gas inside the afore-mentioned mixed gas supply pipe A, and a silicon wafer drying device 1 comprising a hydrogen radical formation apparatus C equipped with a platinum film at the gas contacting part wherewith a high temperature mixed gas heated with the afore-mentioned mixed gas heating device B is contacted is installed, and a mixed gas containing hydrogen radical formed with the afore-mentioned hydrogen radical formation apparatus C is gushed out onto a rotating silicon wafer 4 after cleaning.

The second preferred embodiment comprises the first preferred embodiment constructed so that a mixed gas supply pipe A comprises a vertical coupling pipe 7 supported so that it is free to move up and down relative to a case body 2 and also free to rotate in the direction of the periphery of circle, and a lateral coupling pipe 10 coupled with the other end of the said vertical coupling pipe 7 and supported horizontally, and at the same time, the afore-mentioned vertical coupling pipe 7 is maintained free to move up and down and also free to rotate in the positive and reverse directions by means of a lift/rotation driving mechanism 8.

The third preferred embodiment comprises the first preferred embodiment constructed so that a sheathed heater installed at a part in a mixed gas supply pipe A is used as a mixed gas heating device B, thus enabling to heat the mixed gas to more than 150° C. by employing the said mixed gas heat device B.

The fourth preferred embodiment comprises the first preferred embodiment so designed that a hydrogen radical formation apparatus C is made to be a hydrogen radical formation/dispersion apparatus 11 equipped with a platinum coated filter fitted at the front end of a mixed gas supply pipe A.

The first preferred embodiment may be so arranged that the mixing ratio of a hydrogen gas is made to be 0.05 Vol %–5.0 Vol %.

The first preferred embodiment may further comprise a coupling pipe body 15 whereupon a vertical coupling pipe is fitted and a sheathed heater 16 wherein the vertical coupling pipe 7 is fitted; and the vertical coupling pipe 9 allows a mixed gas to run through the space between the inside wall face of the afore-mentioned coupling pipe 15 and the outside wall face of the sheathed heater 16 to be heated with the sheathed heater.

The second preferred embodiment may be so arranged that a heater-mounted lateral coupling pipe 10 comprises a stainless-steel-made outer pipe 17, an inner pipe 19 wherein a spacer 18 is installed for its being fixed to allow the mixed gas to run through, a micro sheathed heater 20 wound around the outer perimeter of the inner pipe, and an aluminum-foil-made cover 21 covering the outer perimeter of the outer pipe 19 wound the micro sheathed heater 20.

The second preferred embodiment further may be so arranged that a lift/rotation driving mechanism 8 for a vertical coupling pipe 7 lowers the vertical coupling pipe 7 so that a hydrogen radical formation/dispersion apparatus 11 is maintained and settled at a place whereat the spacing between the lower surface of a platinum coated filter 26 and the upper surface of the silicon wafer 4 facing the filter will be 0.5 mm–3 mm.

The third preferred embodiment may be so arranged that a mixed gas temperature to be supplied to the hydrogen radical formation/dispersion apparatus 11 is maintained at 150° C.–300° C.

The fourth preferred embodiment may be so arranged that a hydrogen radical formation/dispersion apparatus 11 comprises a reverse-dish-shaped upper body 23 having a mixed gas inlet opening 23a at the center of a upper wall, a reflecting plate 25 installed horizontally on the lower face side of the upper body 23 and having a plurality of gas permeating orifices 25a around the outer perimeter, a short cylinder-shaped filter Flange 24 welded onto the lower end surface of the upper body 23, and a platinum coated filter 26 fixed on the lower face side of the filter flange 26 forming a platinum layer on the porous disc made of a stainless-steel-sintered material.

LIST OF REFERENCE LETTERS AND NUMERALS

A Mixed gas supply pipe
B Mixed gas heating device
C Hydrogen radical formation apparatus
1 Silicon wafer drying device
2 Case body
3 Wafer support/rotation driving mechanism
3a Support disc
3b Rotation driving part
4 Silicon wafer
5 Gas supply panel
6 Flexible coupling pipe
7 Vertical coupling pipe
8 Lift/rotation driving mechanism
9 Heater-mounted vertical coupling pipe
10 Heater-mounted lateral coupling pipe
11 Hydrogen radical formation/dispersion apparatus
12a Pressure regulator
12b Pressure gauge
12c Mass flow controller
12d•12e Valves
13a Pressure regulator
13b Pressure gauge
13c Mass flow controller
13d•13e Valves
14 Gas mixer
15 Coupling pipe body
15a Gas inlet opening
16b Gas outlet opening
15c Lead wire dragging-out opening
16 Sheathed heater
16a Heat generation part
16b Thermoelectric couple
16c Lead for input
16d Lead for thermoelectric couple
17 Outer pipe
18 Spacer
19 Inner pipe
20 Micro sheathed heater
21 Aluminum-foil-made cover
22 Union joint
23 Upper body
23a Mixed gas inlet opening
24 Filter flange
25 Reflecting plate
25a Gas permeating orifice
26 Platinum coated filter

DETAILED DESCRIPTION OF THE INVENTION

The following embodiments in accordance with the present invention are described hereunder with reference to the drawings.

Figure 1:
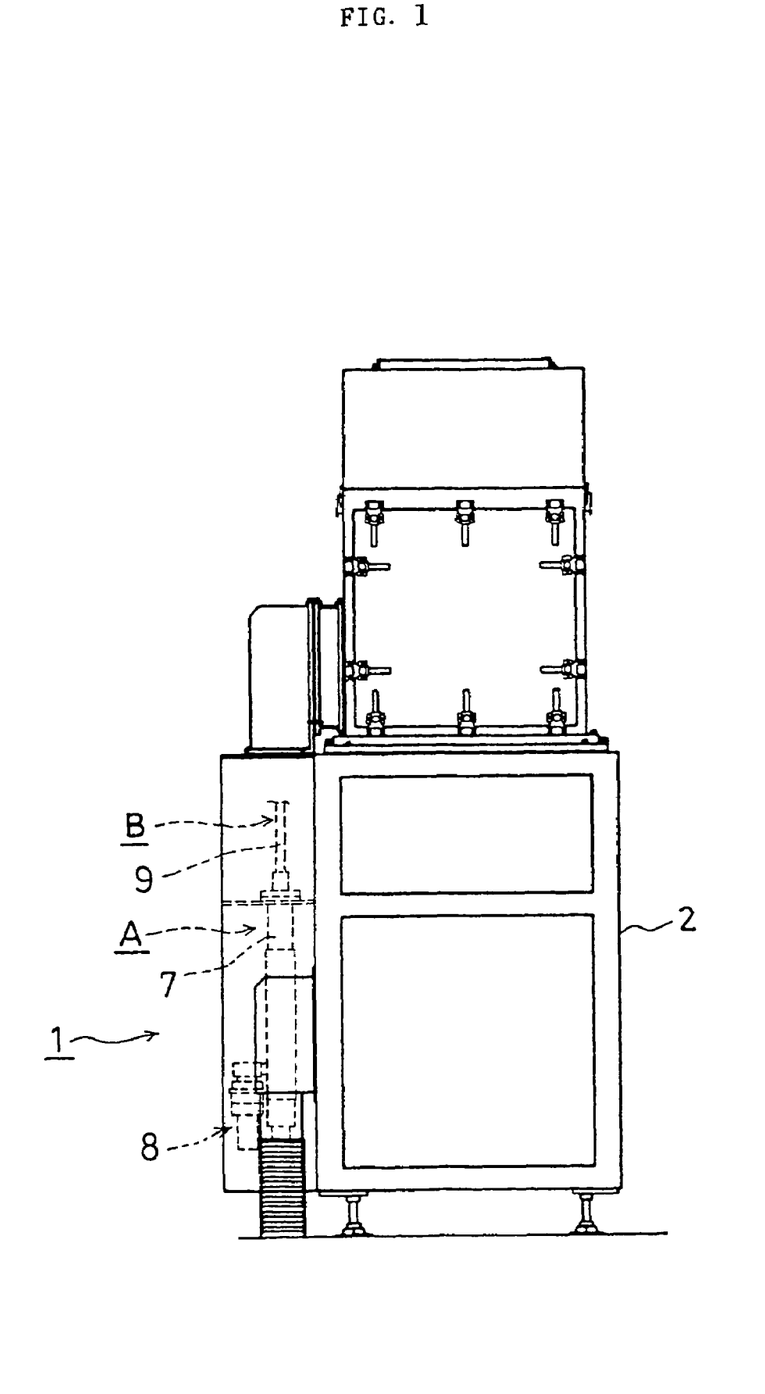
FIG. 1 is a front view of a wafer cleaning device illustrating an embodiment according to the present invention.
Figure 2:
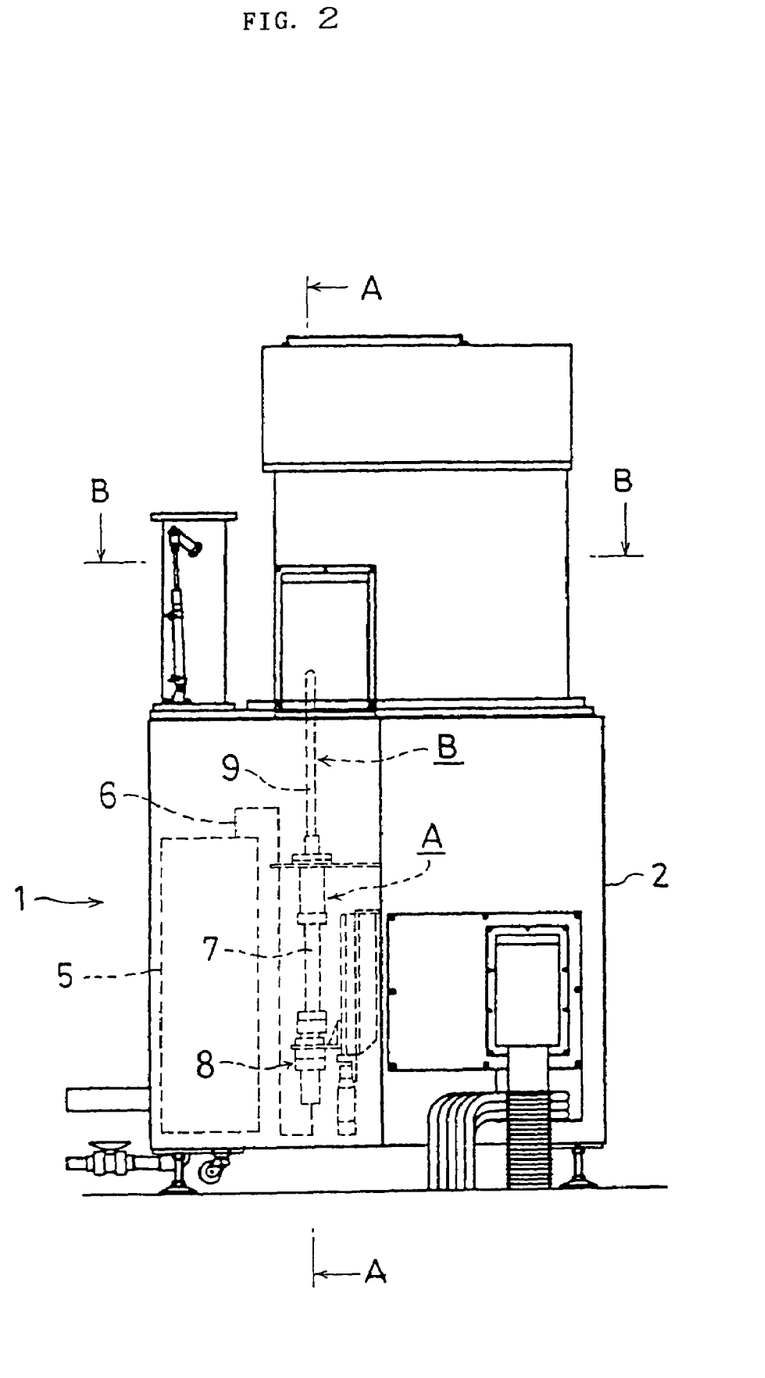
FIG. 2 is a right side view of FIG. 1.
Figure 3:
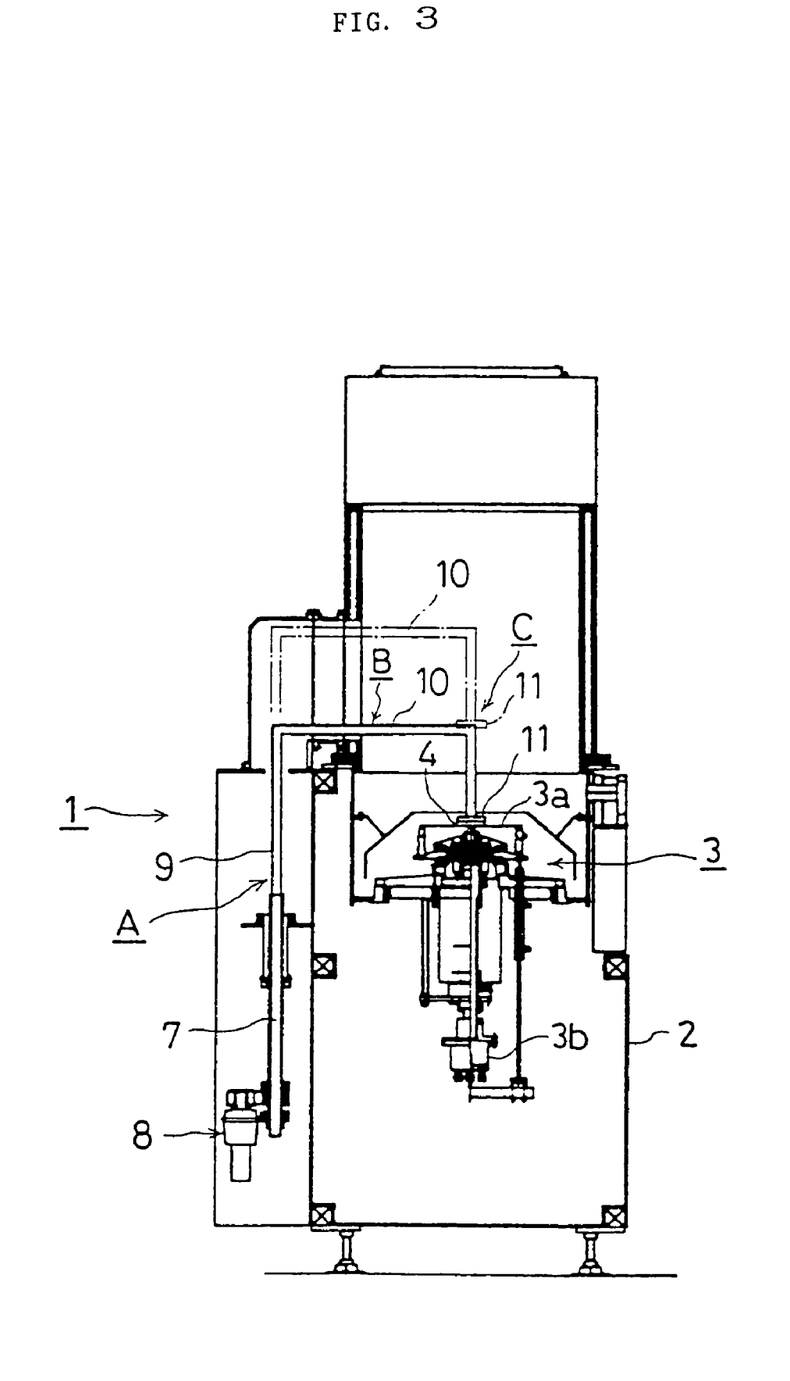
FIG. 3 is a schematic illustration taken on line A—A in FIG. 2.
Figure 4:
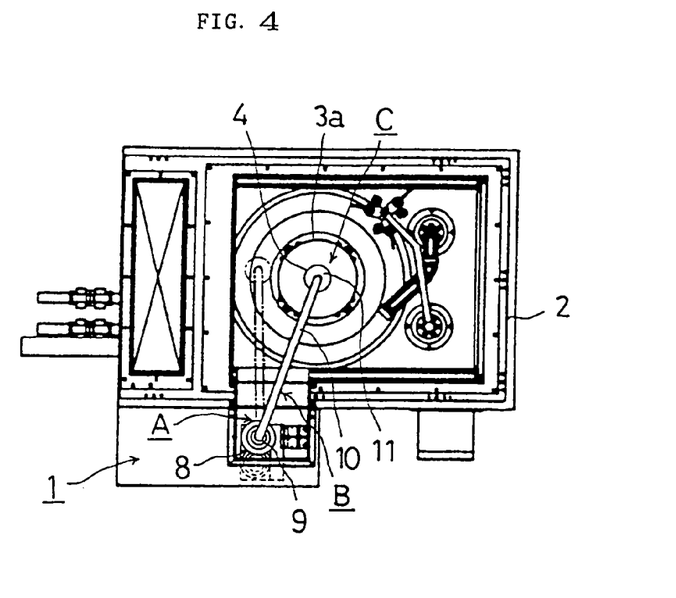
FIG. 4 is a schematic sectional illustration taken on line B—B in FIG. 2.

FIG. 1 is a front view of a rotation type silicon wafer cleaning device illustrating an embodiment according to the present invention. FIG. 2 is a side view of the device. FIG. 3 is a schematic sectional illustration taken on line A—A in FIG. 2. FIG. 4 is a schematic illustration taken on line B—B in FIG. 2. It is to be noted that any type of cleaning devices can be employed as long as it is of a rotation type even though a so-called single wafer processing cleaning device is described in the present invention.

Referring to FIGS. 1–4 inclusive, 1 designates a silicon wafer drying device, 2 a case body, 3 a wafer support/rotation driving mechanism, 4 a silicon wafer, 5 a gas supply panel, 6 a flexible coupling pipe, 7 a vertical coupling pipe, 8 a lift/rotation driving mechanism, 9 a heater-mounted vertical coupling pipe, 10 a heater-mounted lateral coupling pipe, and 11 a hydrogen radical formation/dispersion apparatus. And, A designates a mixed gas supply pipe comprising a flexible coupling pipe 6, a vertical coupling pipe 7, heater-mounted vertical coupling pipe 9, a heater-mounted lateral coupling pipe 10 and the like, B a mixed gas heating device installed on a part of the mixed gas supply pipe A, and C a hydrogen radical formation apparatus installed on the down-stream side of the mixed gas heating device B.

The afore-mentioned rotation type silicon wafer cleaning device is formed by arranging a silicon wafer drying device 1 comprising a after-mentioned gas supply panel 5, a mixed gas supply pipe A, a mixed gas heating device B, a hydrogen radical formation apparatus C and the like; a support/rotation driving mechanism 3 for the wafer 4 comprising a support disc 3a, a rotation driving part 3b and the like; an automatic setting/removing device (not illustrated) for the wafer 4; an automatic carry-in/carry-out device (not illustrated) for the wafer 4; a jet-spray device (not illustrated) for chemical cleaning agents such as hydrofluoric acid and the like; a jet-spray device (not illustrated) for cleaning water such as pure water and the like; and the like in the case body 2.

A detailed explanation of a wafer support/rotation driving mechanism 3 comprising the afore-mentioned support disc 3a and a rotation driving part 3b, an automatic setting/removing device for a wafer, and automatic carry-in/carry-out device for the wafer, a jet-spraying device for chemical cleaning agents, a jet-spraying device for cleaning water such as pure water and the like is omitted herewith because they are publicly disclosed.

Figure 5:
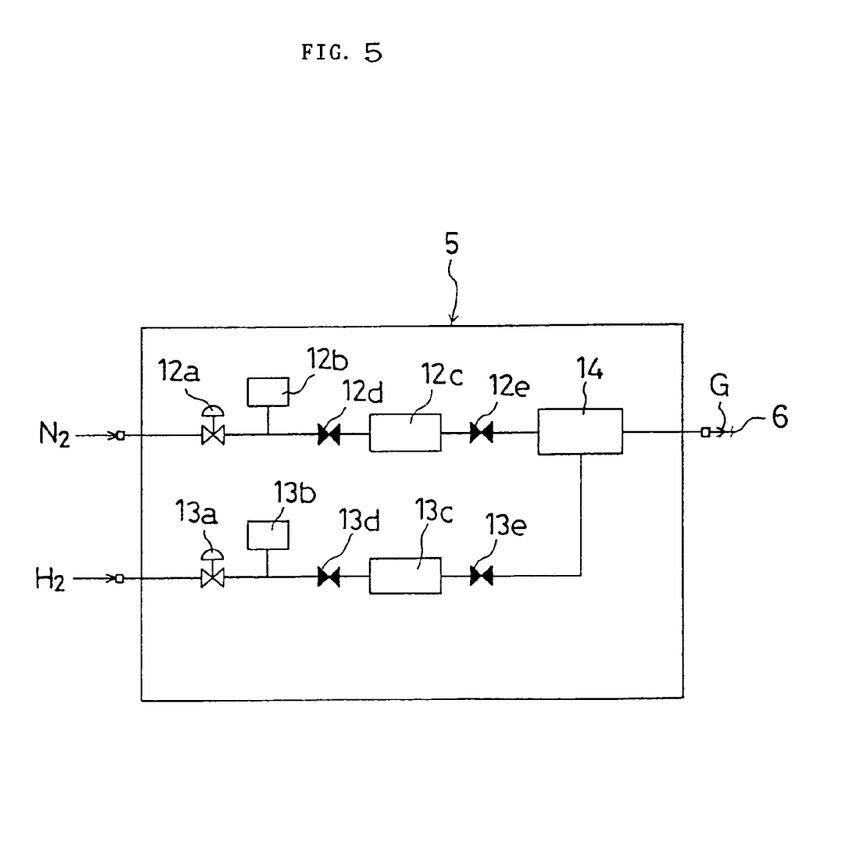
FIG. 5 is a diagram illustrating a composition of a gas supply panel.

The afore-mentioned gas supply panel 5 installed and fixed on the side part inside a case body 5 supplies a mixed gas G of an inactive gas with no reaction with hydrogen (such as $N_2$ gas) and $H_2$ as illustrated in FIG. 5 to a hydrogen radical formation/dispersion apparatus 11 through a mixed gas supply pipe A comprising an the after-mentioned flexible coupling pipe 6, a vertical coupling pipe 7, a heater-mounted vertical coupling pipe 9, a heater-mounted lateral coupling pipe 10 and the like.

In the embodiment according to the present invention, it is so constructed that a gas supply panel 5 and the like are housed inside the case body 2. However, there is no need to say that they can be installed outside the case body 2. Further, in the embodiment according to he present invention, heating of the after-mentioned mixed gas G is performed at two separate places, that is, a heater-mounted vertical coupling pipe 9 and a heater-mounted lateral coupling pipe 10. However, it is also possible that heating is performed either at the former heater-mounted vertical coupling pipe 9 or at the latter heater-mounted lateral coupling pipe 10.

Furthermore, in the embodiment according to the present invention, a mixed gas heating device B is formed by heaters installed on a vertical coupling pipe 9 and a lateral coupling pipe 10. However, the formation of a mixed gas heating device B can be of any type. Also, either an indirect or direct heating method can be applied to heat the mixed gas G.

Concretely, as illustrated in FIG. 5, the afore-mentioned gas supply panel 5 is formed by a $N_2$ supply line comprising a pressure regulator 12a, a pressure gauge 12b, a mass flow controller 12c and valves 12d and 12e; a $H_2$ supply line comprising a pressure regulator 13a, a pressure gauge 13b, a mass flow controller 13c and valves 13d and 13e; and a gas mixer 14 for $H_2$ and $N_2$. In the embodiment according to the present invention, it is so arranged that $N_2$ and $H_2$ are mixed inside the gas mixer 4, and a mixed gas with $N_2$ and $H_2$ containing 0.1 Vol % of $H_2$ is supplied to a hydrogen formation/dispersion apparatus 11 at the flow rate of approximately 30 SLM (liters per minute under standard conditions).

In the afore-mentioned embodiment according to the present invention, a hydrogen radical formation/dispersion apparatus 11 installed at the front end of the down-stream side of the mixed gas supply pipe A is employed for a hydrogen radical formation apparatus C. However, the said hydrogen radical formation apparatus C can be of any construction as long as the gas contacting part for a mixed gas G is equipped with a platinum film.

There is no need to say that the hydrogen radical formation apparatus C can be installed at any place as long as it is installed down-stream of the mixed gas heating device B.

In the afore-mentioned embodiment according to the present invention, a mass flow controller 12c for $N_2$ and a mass flow controller 13c for $H_2$ employ one for the flow rate of 50 SLM and one for the flow rate of 100 SCCM respectively. SLM and SCCM indicate flow rates expressed in l/min and cc/min respectively under the standard conditions.

In the embodiment according to the present invention, the mixing ratio of $H_2$ in the mixed gas G is set at approximately 0.1 Vol %. It should be noted that it is desired that the mixing ratio of $H_2$ is set at around 0.01–5.0 Vol % for the reasons that the level of a so-called hydrogen termination treatment of Si will not be enhanced due to the fact that it is saturated and the volume loss increases even when the mixing ratio of $H_2$ is raised to higher than 5.0 Vol %, while the level of a hydrogen termination treatment of Si will be lowered when the mixing ratio of $H_2$ is lowered below 0.01% due to the fact that the level of a hydrogen treatment of Si will be decreased, making it difficult to perform the hydrogen termination treatment properly or making the treatment more time-consuming.

In the embodiment according to the present invention, it is so arranged that a mixed gas G with a flow rate of 30 SML is supplied to a hydrogen radical formation/dispersion apparatus 11 for 2–3 minutes for the drying treatment of a wafer 4 with the outside diameter of approximately 54 mm φ as explained later. However, the outside diameter of a wafer to be treated is not limited to that in the said embodiment, and the flow rate of the mixed gas to be treated can be appropriately adjusted depending on the outside diameter of the wafer 4 to be cleaned, the time for the drying treatment, a temperature of the mixing gas and the like.

In the embodiment according to the present invention, a stainless-steel flexible tube with the outside diameter of 35 mm φ, which inner surface is electrolytically polished, is employed for the afore-mentioned flexible coupling pipe 6, and, as illustrated in FIG. 1, and secured removably between the outlet side of the gas supply panel 5 and the lower end part of the vertical coupling pipe 7.

Similarly, a stainless-steel tube with the outside diameter of 6.35 mm φ, which inner surface is electrolytically polished, is employed for the afore-mentioned vertical coupling pipe 7, and installed in a vertical position inside the case body 1, and supported rotation-free and traveling-free upward and downward thereto.

Namely, the outer peripheral surface of the lower end part of the said vertical coupling pipe 7 is engaged with and supported by the after-mentioned lift/rotation driving mechanism 8, thus making the vertical coupling pipe 7 slide upwards and downwards within a prescribed distance (approximately 200 mm in the embodiment), and rotate both forwardly and reverse to the peripheral direction within the prescribed range of an angle (approximately 20° in the embodiment) with the operation of the lift/rotation driving mechanism.

The after-mentioned heater-mounted vertical coupling pipe 9 is connected to the upper end part of the said vertical coupling pipe 7, thus forming a passage for the flow of a mixed gas G in the vertical direction with both coupling pipes 7 and 8.

The afore-mentioned lift/rotation driving mechanism 8 allows a vertical coupling pipe 7, a heater-mounted vertical coupling pipe 9 and the like to slide to up and downward directions, and the shaft of a vertical coupling pipe 7 to rotate forwardly and reverse for the angle θ to the peripheral direction (approximately 20° in the embodiment). It is so constituted in the embodiment that a vertical coupling pipe 7 is slid upwards and downwards by means of combining a motor driving part with a rack mechanism, and the vertical coupling pipe 7 rotates forwardly and reverse for the prescribed angle of θ to the peripheral direction by means of combining a motor driving part with a gear mechanism.

The afore-mentioned lift/rotation driving mechanism 8 can be of any construction such as a lifurotation driving mechanism 8 with an air cylinder type or an oil pressure cylinder type.

Figure 6:
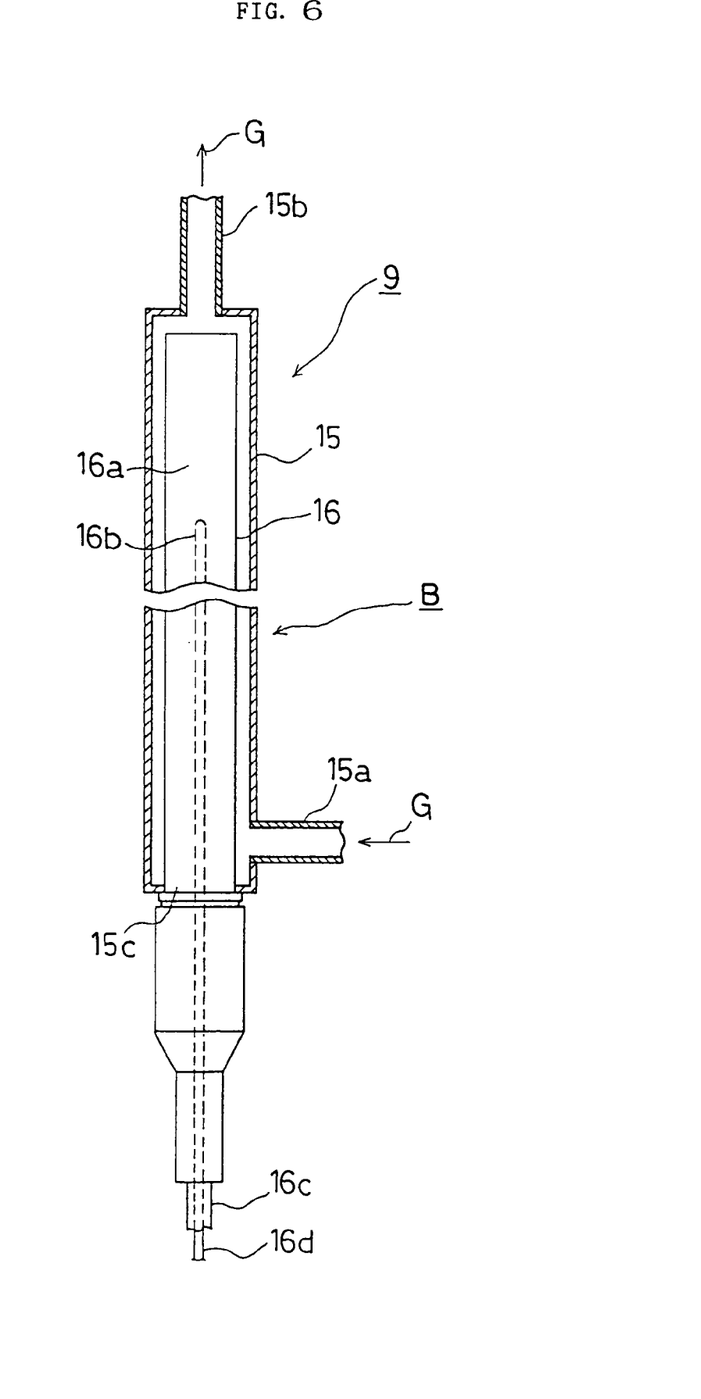
FIG. 6 is a schematic sectional illustration of a heater-mounted vertical coupling pipe.

As illustrated in FIG. 6, the afore-mentioned heater-mounted vertical coupling pipe 9 is formed with a coupling pipe body 15 and a sheathed heater 16 housed in the coupling pipe body 15, and a gas inlet opening 15a, a gas outlet opening 15b and a lead wire dragging-out opening 15c are installed on the coupling pipe body 15 respectively.

In the embodiment according to the present invention, a stainless-steel pipe with an inner surface, which outer diameter is 19.05 mm φ and inner surface is electrolytically polished, is employed for a coupling pipe body 15, and a space made between the outer peripheral surface of a sheathed heater 16 inserted and fitted to the inside thereof and the inner wall surface of a coupling pipe body 15 forms a flow passage. Also, a stainless-steel pipe with the outer diameter of 6.35 mm φ, which inner wall surface is electrolytically polished, is employed for a gas inlet opening 15a and a gas outlet opening 15b.

The afore-mentioned sheathed heater 16 is formed with a heat generation part 16a, a thermoelectric couple 16b, a lead for input 16c, a lead for the thermoelectric couple 16d, and the like. In the embodiment according to the present invention, a heat generation part 16a with capacity of 20 V and 200 W and the like inserted in and fitted to the inside of the stainless-steel pipe with the outer diameter of 12 mm φ and are employed for the sheathed heater 16.

The capacity of a sheathed heater 16 and the effective sectional area of a flow passage inside a coupling pipe body 15 are determined appropriately depending on the flow rate of the gas passing through inside a heater-mounted vertical coupling pipe and the degree and velocity of temperature rise and the like of the mixed gas G.

In the embodiment according to the present invention, two pieces of a sheathed heater 16 equipped with a heat generation part 16a with capacity of 200 W are employed to heat and raise the mixed gas of approximately 30 SLM ($H_2$ 0.1% and $N_2$ 99.9%) to 100° C.–150° C. within 5–20 seconds. Of course, any gas can be employed instead of $N_2$ to form the mixed gas as long as it does not react with hydrogen.

In the embodiment according to the present invention, a gas inlet opening 15a is installed on the lower part of the outer peripheral surface of the coupling pipe body 15 used for a heater-mounted vertical coupling pipe 9. Therefore, axes of the vertical coupling pipe 7 and the heater-mounted vertical coupling pipe 9 are not lined linearly. However, it is possible that both axes of the vertical coupling pipe 7 and the heater-mounted vertical coupling pipe 9 can be positioned linearly by replacing the position of a lead wire dragging-out opening 15c with the position of a gas inlet opening 15a.

The afore-mentioned heater-mounted lateral coupling pipe 10 is coupled in a horizontal position with the upper end part of the heater-mounted vertical coupling pipe 9. At the front end part, the after-mentioned hydrogen radical formation/dispersion apparatus 11 is installed and fixed. Of course, it is possible that a heater is installed inside the hydrogen radical formation/dispersion apparatus 11.

Figure 7:
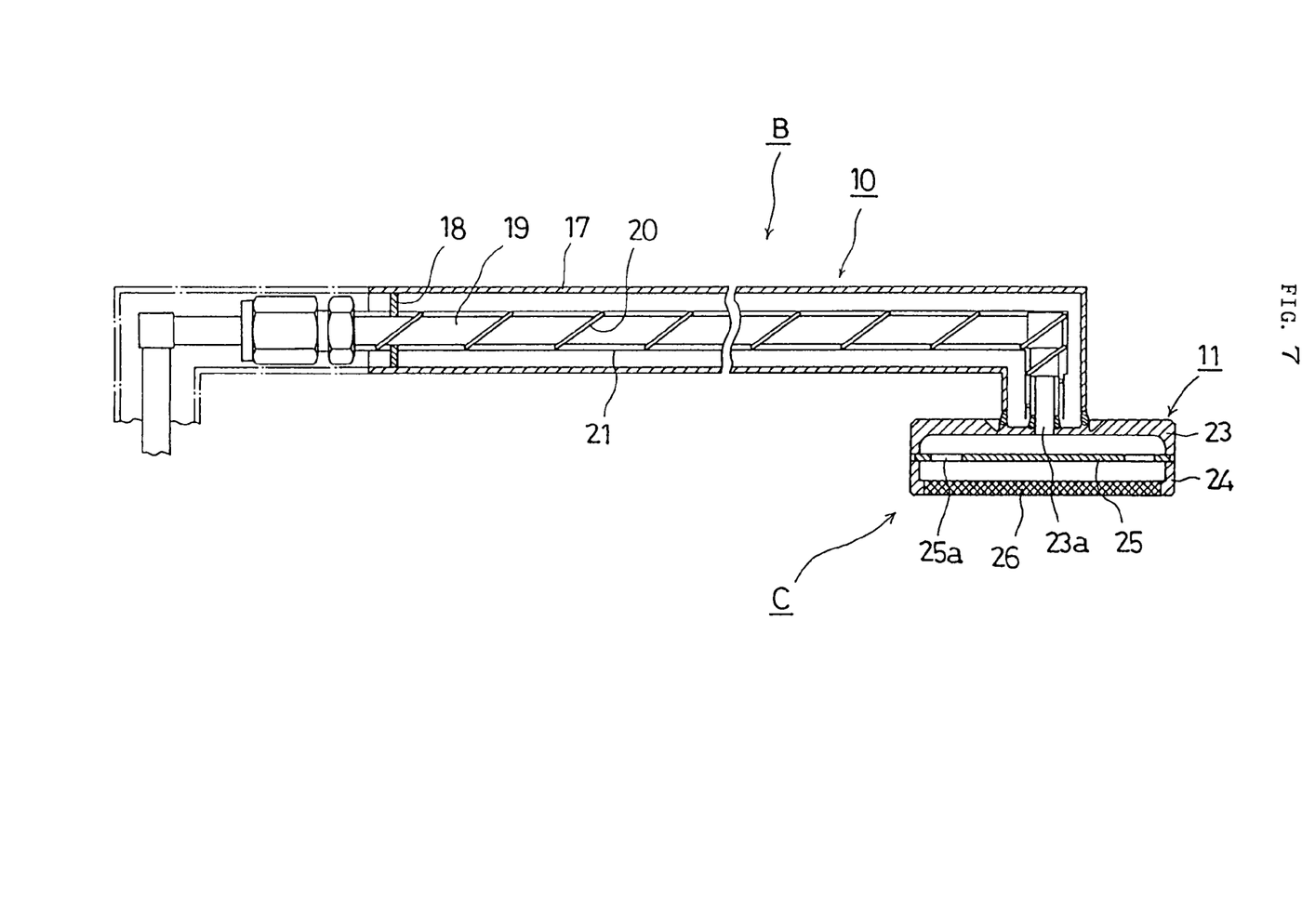
FIG. 7 is a schematic sectional illustration of a heater-mounted lateral coupling pipe.

FIG. 7 is a schematic sectional illustration of a heater-mounted lateral coupling pipe 10 employed for a rotation type wafer cleaning device in the embodiment according to the present invention. There is formed a heater-mounted lateral coupling pipe 10 in the manner that a stainless-steel-made inner pipe 19 with an outer diameter of 6.35 mm φ, which inner wall surface I electrolytically polished, is supported and fixed inside the stainless-steel-made outer pipe 17 with the outer diameter of 19.05 mm φ by means of installing a spacer 18, and the outer peripheral surface of the inner pipe 19 is wounded by a micro sheathed heater 20 at an appropriate pitch and the upper part of which is covered by a aluminum foil 21.

In the embodiment according to the present invention, a mixed gas G of approximately 100° C.–120° C. and approximately 30 SLM supplied through a heater-mounted vertical coupling pipe 9 is heated to approximately 200° C.–250° C. while passing through an inner pipe 19 by means of 6 pieces of micro sheathed heater 20 with capacity of 150 W, and then supplied into the after-mentioned hydrogen radical formation/dispersion apparatus 11 from its front end part.

In the embodiment according to the present invention, the length of a heater-mounted lateral coupling pipe 10 is made approximately 400–500 mm. Furthermore, as illustrated in FIGS. 3 and 4, the said heater-mounted lateral coupling pipe 10 travels in the range of approximately 200 mm to the up and down directions and also approximately 20° at the angle to the horizontal direction respectively by means of the operation of a lift/rotation driving mechanism.

There is no need to say that heat-insulation materials not illustrated in the afore-mentioned FIGS. 6 and 7 are applied around the outer peripheral part of the coupling pipe body 15 of the heater-mounted vertical coupling pipe 9 and also around the outer peripheral part of the outer pipe 17 of the heater-mounted lateral coupling pipe 10.

A hydrogen radical formation/dispersion apparatus 11 is welded to the front end part of the afire-mentioned heater-mounted lateral coupling pipe 10. A radicalized hydrogen-contained nitrogen gas is gushed out from the said hydrogen radical formation/dispersion apparatus 11 toward the outer surface of a silicon wafer 4 positioned thereunder.

As illustrated in FIG. 7, the afore-mentioned hydrogen radical formation/dispersion apparatus 11 comprises a stainless-steel-made and reversed-dish-shaped upper body 23, a disc-shaped reflecting plate welded to the lower end edge of the upper body 23 and the upper end part of the cylinder-shaped filter flange 24, and a disc-shaped platinum coated filter 26 fixed to the lower end edge of the filter flange 24.

Namely, there is formed a mixed gas inlet opening 23a on the center of the upper wall surface of the afore-mentioned reverse-dish-shaped upper body 23, and a mixed gas G heated to approximately 150° C.–250° C. is led to the inside of the upper body 23 through the said gas inlet opening 23a.

The afore-mentioned disc-shaped reflecting plate 25 is made of stainless-steel, and there are made a plurality of gas permeating orifices 25a on its outer peripheral part. The outer peripheral edge of the said reflecting plate is welded to the upper body 23 in such a state as it being held between the upper end surface of a short cylinder-shaped filter flange 24 and the lower end surface of the upper body 23.

Furthermore, the afore-mentioned platinum coated filter 26 is formed by coating platinum on the outer surface of the stainless-steel-made filter material. In the embodiment according to the present invention, pieces of a net-shaped body of approximately 8 mesh formed with the stainless-steel-made wire with the outer diameter of 1 μm are stacked and sintered to make a disc-shaped filtration material with the thickness of approximately 2–3 mm, the outer diameter of approximately 60 mm and the average pore size of 20 μm, and to form a platinum layer with the thickness of approximately 0.3 μm on the outer surface of a pore of the said filtration material by means of vapor deposition.

There is no need to say that the method to form a platinum layer on the stainless-steel-made filtration material is not limited to the afore-mentioned method of vapor deposition, but any other methods such as an ion plating method can be applied as long as a platinum layer is formed on the outer surface of the stainless steel.

In the embodiment according to the present invention, a sintered material is employed as the stainless-steel-made filtration material, and the average pore size, the thickness, and the thickness of a platinum layer are set at 20 μm, approximately 2–3 mm and approximately 0.3 μm respectively. However, the method of forming a filtration material, the thickness, the external dimensions and the average pore size of the material as well as the thickness of a platinum layer and the like are not limited to values on the embodiment according to the present invention, but they can be appropriately determined depending on the flow rate and the duration of gushing-out of the gas G, the external dimensions of a silicon wafer 4 and the like.

A platinum coated filter 26 for the afore-mentioned hydrogen radical formation/dispersion apparatus 11 is horizontally maintained at and fitted to the lower end part of the short cylinder-shaped filter flange 24 by means of a screw stopping mechanism.

As a hydrogen radical formation/dispersion apparatus 11 is lowered by means of a lift/rotation driving mechanism 8, the lower face side of the said platinum coated filter 26 goes down in the neighborhood of the outer surface of the wafer 4 set on the wafer support disc 3a.

Even though the smaller is the better for the spacing between the lower surface side of the afore-mentioned platinum coated filter 26 and the outer surface of the wafer 4, it is normally set at approximately 0.5–1.5 mm from the view point of durability and the like of the activity of hydrogen radical formed by the after-mentioned catalytic action of platinum.

Now, the operation of a rotation type silicon wafer cleaning device in accordance with the present invention is explained.

Referring to FIGS. 1–4 inclusive, a wafer 4 to be treated for cleaning is automatically set and fitted on a support disc 3a of the wafer cleaning device, and the wafer 4 starts rotating at the high speed (approximately 2000–2500 RPM) by the operation of the wafer support/rotation driving mechanism 3.

Next, so-called acid cleaning is performed by a chemical cleaning agent such as hydrofluoric acid and the like being jet-sprayed onto the wafer 4 rotating at the high speed. Furthermore, upon completion of the said acid cleaning, pure water cleaning is performed by pure water being jet-sprayed onto the outer surface of the wafer 4.

Detailed explanation on the afore-mentioned chemical cleaning and pure water cleaning treatments is omitted herewith due to the reason that these treatments are well disclosed.

Upon completion of the pure water cleaning treatment, draining is performed while the wafer 4 rotates at the high speed, and at the same time, by having a lift/rotation driving mechanism 8 work to lower and rotate a vertical coupling pipe 7, a heater-mounted vertical coupling pipe 9 and a heater-mounted lateral coupling pipe 10 integrally, a hydrogen radical formation/dispersion apparatus 11 at the front end of the heater-mounted lateral coupling pipe 10 travels from the retreat position (a dotted line) to the operation position (a solid line) in FIGS. 3 and 4.

Immediately after the operation of the afore-mentioned lift/rotation driving mechanism 8 gets started (or after an appropriate lapse of time), the gas supply panel 5 starts operating to supply a mixed gas G with $H_2$ and $N_2$ containing $H_2$ of 0.1% at the flow rate of 30 SLM from a gas mixer 14 to a vertical coupling pipe 7. It is desirable that a hydrogen radical formation/dispersion apparatus 11 has completed its traveling to the operational position before starting the supply of the said mixed gas G.

The mixed gas G supplied to a vertical coupling pipe 7 is heated to approximately 80° C.–150° C. with a sheathed heater 16 while passing through a heater-mounted vertical coupling pipe 9. And, the mixed gas G heated inside the vertical coupling pipe 9 is continuously heated while passing inside a heater-mounted lateral coupling pipe 10 to approximately 150° C.–300° C., thus being led to the inside of the hydrogen radical formation/dispersion apparatus 11.

Referring to FIG. 7, the mixed gas that gushes in to the inside of the upper body 23 of the hydrogen radical formation/dispersion apparatus 11 through a mixed gas inlet opening 23a is dispersed by collidiing with a reflecting plate 25, and is let to the upper surface side of a platinum coated filter 26 through a gas permeating orifice 25a. After the hydrogen gas is converted to hydrogen radical by the catalytic action of platinum while passing through a filter 26, it is then gushed out together with $N_2$ onto the wafer 4.

A mixed gas G gushed out onto the afore-mentioned filter 26 is heated to the high temperature of 150° C.–300° C. (approximately 250° C. in the embodiment according to the present invention).

As the result, a mixing gas G turn to hydrogen radical when the hydrogen in the mixed gas is activated by means of contacting with a platinum catalyst while passing through the filter 26, thus the binding of Hydrogen with Si atoms is remarkably enhanced.

Namely, gushing out a mixed gas G dominantly composed of $N_2$ containing hydrogen radical onto the wafer 4 rotating at the high speed from the lower face of the filter 26 hydrogen atoms are firmly and easily bonded with Si atoms exposed through the pure water cleaning, and thus, a hydrogen termination is thoroughly completed for Si atoms on the outer surface of the wafer without any mottles.

The radicalization of hydrogen in the afore-mentioned mixed gas G by means of employing platinum can be sufficiently performed when the temperature of the mixed gas reaches higher than 150° C. In the embodiment according to the present invention, the temperature of the mixed gas has been raised to 250° C. taking some margin into consideration.

Figure 8:
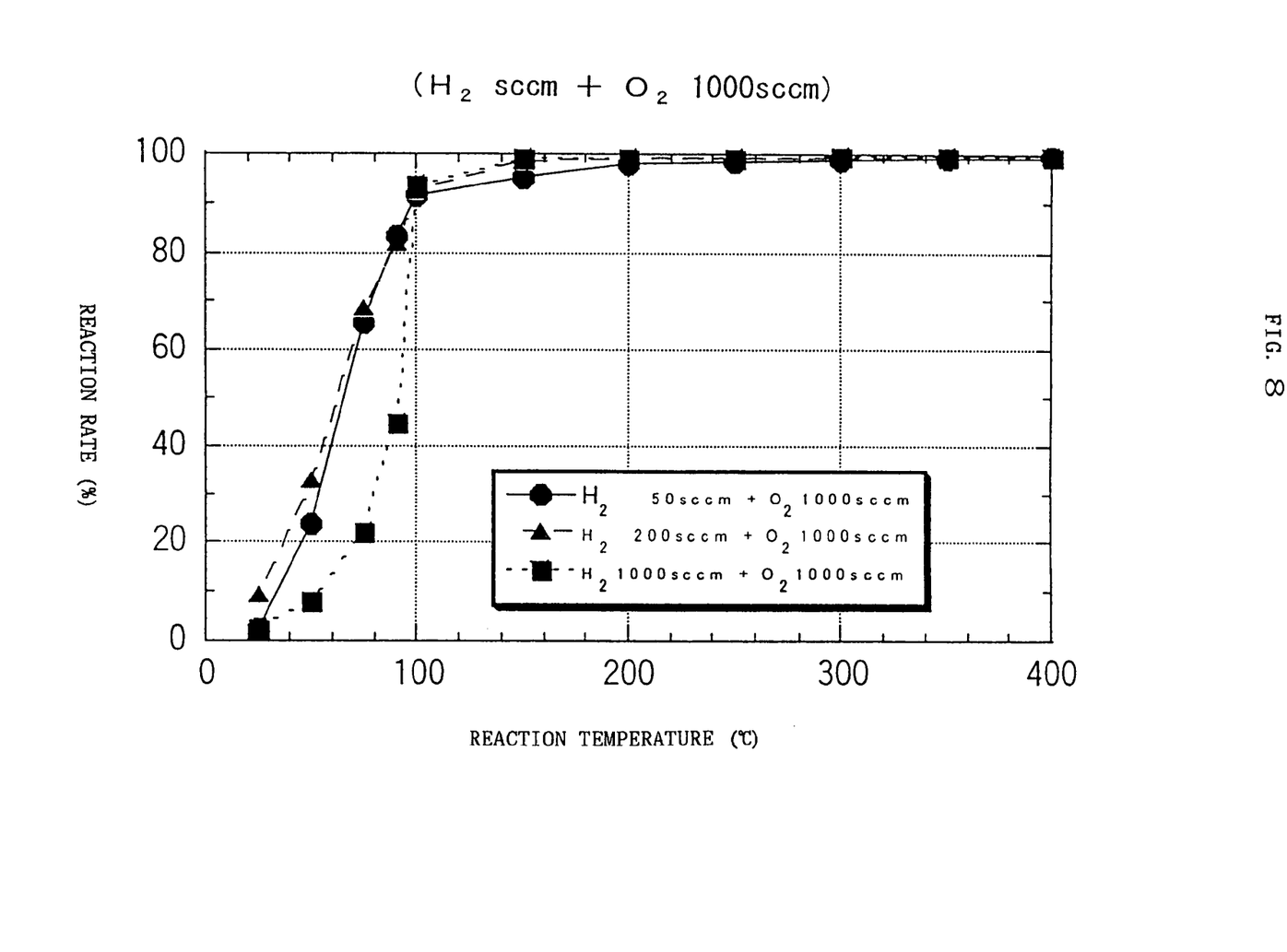
FIG. 8 is a characteristic curve displaying the relation of a temperature and a reaction ratio at the reaction of hydrogen activated by the platinum catalysis and oxygen.

It is evident that the limiting temperature to form hydrogen radical is approximately 150° C. as illustrated in FIG. 8 wherein the relation curve between the reaction ratio and the temperature is shown in case that water is produced by the reaction of radicalized hydrogen with oxygen employing platinum as a catalyst. The fact that the reaction ratio reaches closely 100% when the temperature exceeds approximately 150° C. indicates that hydrogen is almost completely radicalized at the temperature of approximately 150° C.

In the embodiment according to the present invention, the spacing of a hydrogen radical formation/dispersion apparatus 11 and a wafer 4 is set for approximately 1 mm. It should be noted that the smaller spacing is the better. Accordingly, sufficient hydrogen termination treatment cannot be expected when the afore-mentioned spacing becomes wider than approximately 3 mm because hydrogen radical vanishes between the outer surface of the filter 26 and the outer surface of the wafer 4.

At the same time, contrary to this fact, when the afore-mentioned spacing is made smaller than 0.5 mm, it becomes inappropriate because of the possible danger of the wafer 4 rotating at the high speed being contacted with the filter 26. Due to this reasons, the afore-mentioned spacing is set at 1 mm in the embodiment according to the present invention.

It would be sufficient if the release of the mixed gas G is performed through the afore-mentioned hydrogen radical formation/dispersion apparatus 11 for approximately 2–3 minutes. In the embodiment according to the present invention, the drying of the Si wafer with the outer diameter of 60 mm φ rotating at the speed of 200 RPM is perfectly achieved by releasing the mixed gas G which temperature and flow rate are 250° C. and 30 SLM respectively, and at the same time nearly perfect hydrogen termination treatment of Si atoms on its outer surface is performed.

Embodiment

A Si wafer 4 having an outer diameter of 60 mm φ is treated for cleaning with hydrofluoric acid and pure water, and rotates at the speed of 2000 RPM while its Si surface is completely exposed. And, then a mixed gas with $H_2$ and $N_2$ Containing $H_2$ of 0.1% is supplied to a hydrogen radical formation/dispersion apparatus 11 at the speed of 30 SLM.

The spacing between the filter 26 and the Si wafer is made 1 mm, thus making the mixed gas G gushed out for 2 minutes continuously through the space.

A filter 26 having the outer diameter of 54 mm φ, the thickness of 2.5 mm is formed in the shape of a disc comprising a sintered body made of a stainless-steel-made meshed net body having a pore with an average size of 20 μm and the temperature of the mixed gas at an inlet opening of the filter is set at 250° C.

When a wafer 4 dried and treated for the hydrogen termination with the silicon wafer drying device 1 in the afore-mentioned embodiment is left in the cleaned air for natural oxidation, it was found that no significant change in appearance such as discoloration is noticed on the outer surface of the silicon wafer even after the lapse of approximately 48 hours.

A test was conducted for comparison. In the test, a Si wafer 4 processed for the same pre-cleaning with hydrofluoric acid and pure water was made to rotate at the speed of 2000 RPM, and a $N_2$ gas of the temperature of 250° C. was jet-sprayed onto the outer surface of the Si wafer 4 continuously for 2 minutes using a dispersion apparatus equipped with the identical filter with no platinum coating was done at the flow rate of 30 SLM.

The Si wafer 4 treated for drying was left in the cleaned air for natural oxidation in the comparison test, and discoloration due to the formation of an oxide film was noticed on the outer surface of the silicon wafer after the lapse of approximately 48 hours.

As evident from the result of the afore-mentioned observation in appearance, when a drying treatment is performed employing a rotation type silicon wafer cleaning device according to the present invention, it is clear that Si atoms on the outer surface of the Si wafer reach a high degree of hydrogen termination. This enables the outer surface of the silicon wafer processed for the post-cleaning to be maintained in stable conditions for a long period of time.

Generally, the degree of hydrogen termination on the silicon outer surface is judged by observing the peak of infrared absorption of Si—H (in the neighborhood of 2200 $Cm^{-1}$) by means of the so-called FT-IR (the ATR method).

Figure 9:
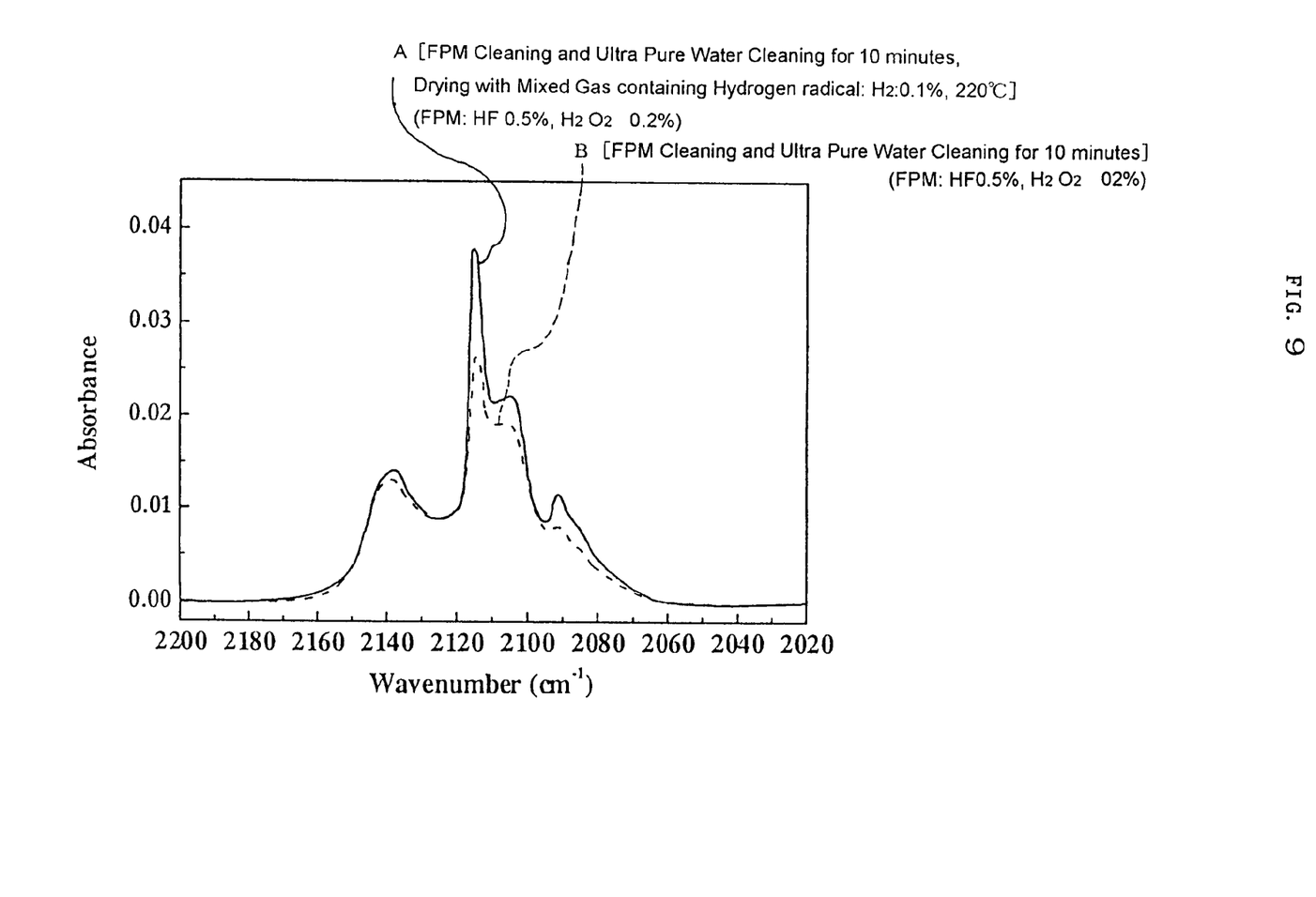
FIG. 9 is a characteristic curve of the infrared absorption of Si—H on the silicon wafer immediately after a hydrogen termination treatment is achieved according to the present invention.

Referring to FIG. 9, there is shown a result of measuring infrared absorption of Si—H on the silicon wafer using the FT-IR-ATR method immediately after cleaning and drying treatments are conducted by means of the method shown in the afore-mentioned embodiment employing a rotation type silicon wafer cleaning device in accordance with the present invention. It has been confirmed that in the case that when a drying treatment (a hydrogen termination treatment) is performed with the mixed gas G containing hydrogen radical (as shown in the curve A), the peak of infrared absorption of Si—H becomes higher compared with the peak in the case without that hydrogen radical (as shown in the curve B).

Effects of the Invention

According to the present invention, a silicon wafer drying device comprising a hydrogen radical formation apparatus C equipped with a platinum film on the gas contacting part, a mixed gas heating device B, a mixed gas supply pipe A, a gas supply panel and the like is installed inside the case body of a rotation type silicon wafer cleaning apparatus, thus drying the wafer by gushing out the mixed gas of hydrogen and inactive gas heated to more than 150° C. through the afore-mentioned hydrogen radical formation apparatus C to make hydrogen radical by means of the catalytic action with the afore-mentioned platinum coated film, and jet-spraying the mixed gas containing the said hydrogen radical onto the wafer.

As the result, a high degree of the hydrogen termination treatment can be achieved because Si atoms on the outer surface of the silicon wafer wherein Si is exposed after the pure water cleaning, is perfectly bonded with H atoms so that the outer surface of the Si wafer can be maintained in stable conditions for a long period of time.

As explained above, the present invention achieves excellent, practical effects.

What is claimed is:

1. A rotation silicon wafer cleaning device for performing drying and hydrogen termination treatment on an outer surface of a silicon wafer, comprising:
   (a) a case body;
   (b) a silicon wafer support and rotation driving mechanism disposed inside the case body; and
   (c) a silicon wafer drying device including
      (i) a gas supply panel having a gas mixer, the supply panel being disposed to supply a mix of hydrogen gas and inert gas, the mix comprising greater than 0.05% by volume of hydrogen;
      (ii) a mixed gas supply pipe coupled to the gas mixer;
      (iii) a mixed gas heating device disposed to heat the mixed gas in the mixed gas supply pipe; and
      (iv) a hydrogen radical formation and dispersion apparatus disposed to receive the heated mixed gas from the mixed gas supply pipe, having a platinum film disposed to form hydrogen radicals in the heated mixed gas, the hydrogen radical formation and dispersion apparatus disposed to direct the mixed gas containing hydrogen radicals onto a rotating silicon wafer.

2. A rotation silicon wafer cleaning device in accordance with claim 1, wherein said mixed gas supply pipe further comprises:
   (a) a vertical coupling pipe having an end and disposed to move upward and downward within said case body and further disposed to rotate within said case body; and
   (b) a lateral coupling pipe coupled to the end of the vertical coupling pipe and supported horizontally.

3. A rotation silicon wafer cleaning device in accordance with claim 1, wherein said mixed gas heating device comprises a sheathed heater disposed to heat said mixed gas to a temperature higher than 150° C.

4. A rotation silicon wafer cleaning device in accordance with claim 1, wherein said hydrogen radical formation and dispersion apparatus further comprises a platinum coated filter fitted to said mixed gas supply pipe.

5. A rotation silicon wafer cleaning device in accordance with claim 1, wherein said mix of gas comprises hydrogen in a range of 0.05%–5.0% by volume.

6. A rotation silicon wafer cleaning device in accordance with claim 2, wherein said vertical coupling pipe comprises:
   (a) a coupling pipe body having an inner face, and
   (b) a sheathed heater having an outer face and disposed inside the coupling pipe body,
   wherein said vertical coupling pipe is disposed to heat said mixed gas as said mixed gas passes between the inner face of the vertical coupling pipe body and the outer face of the sheathed heater.

7. A rotation silicon wafer cleaning device in accordance with claim 2, wherein said lateral coupling pipe comprises:
   (a) a stainless steel outer pipe,
   (b) an inner pipe having an outer peripheral face and disposed inside the stainless steel outer pipe,
   (c) a spacer disposed to permit mixed gas to pass between the stainless steel outer pipe and the inner pipe,
   (d) a micro sheathed heater wound around the outer peripheral face of the inner pipe, and
   (e) an aluminum foil covering around the micro sheathed heater.

8. A rotation silicon wafer cleaning device in accordance with claim 2, further comprising a lift/rotation driving mechanism disposed to move the vertical coupling pipe between an upper position and a lower position, so that when said vertical coupling pipe is disposed in a lower position, a distance between a lower face of said hydrogen radical formation and dispersion apparatus and an upper face of said silicon wafer becomes between about 0.5 mm–3 mm.

9. A rotation silicon wafer cleaning device in accordance with claim 3, wherein the temperature of the mixed gas to be supplied to a hydrogen radical formation and dispersion apparatus reaches 150° C.–300° C.

10. A rotation silicon wafer cleaning device in accordance with claim 4, wherein said hydrogen radical formation and dispersion apparatus comprises:
    (a) a reverse-dish-shaped upper body having an upper wall, a lower face side, and a mixed gas inlet opening at the center of the upper wall;
    (b) a reflecting plate disposed horizontally on the lower face side of the upper body and having a plurality of gas permeating orifices;
    (c) a short cylinder-shaped filter flange having a lower face side and welded to the lower face side of the upper body; and
    (d) a platinum coated filter comprising a platinum coating on a porous disc made of the stainless-steel-sintered materials, and fixed to the lower face side of the filter flange.

11. A method for performing drying and hydrogen termination treatment on the outer surface of a silicon wafer, comprising the steps of:
    (a) providing a mix of hydrogen and inert gas,
    (b) heating the mixed gas to a temperature of greater than 150° C.,
    (c) passing the heated mixed gas through a platinum catalyst to generate hydrogen radicals to form a heated gas comprising hydrogen radicals, and
    (d) exposing a silicon wafer to the heated gas comprising hydrogen radicals.

12. A method in accordance with claim 11, where said mixed gas is heated to a temperature of 150° C.–300° C.

13. A method in accordance with claim 11, wherein said mix of gas comprises hydrogen in a range of 0.05%–5.0% by volume.

14. A method for performing drying and hydrogen termination treatment on the outer surface of a silicon wafer, comprising the steps of:
    (a) providing a rotation silicon wafer cleaning device, comprising:
        (i) a case body;
        (ii) a silicon wafer support and rotation driving mechanism disposed inside the case body; and
        (iii) a silicon wafer drying device including
            (1) a gas supply panel having a gas mixer, the supply panel being disposed to supply a mix of hydrogen gas and inactive gas, the mix comprising greater than 0.05% by volume of hydrogen;
            (2) a mixed gas supply pipe coupled to the gas mixer;
            (3) a mixed gas heating device disposed to heat the mixed gas in the mixed gas supply pipe; and (4) a hydrogen radical formation and dispersion apparatus disposed to receive the heated mixed gas from the mixed gas supply pipe, having a platinum film disposed to form hydrogen radicals in the heated mixed gas, the hydrogen radical formation and dispersion apparatus disposed to direct the mixed gas containing hydrogen radicals onto a rotating silicon wafer, (b) providing a mix of hydrogen and inert gas through said gas supply panel;

(c) heating said mix of gas with said mixed gas heating device;

(d) passing said heated mixed gas through said hydrogen radical formation and dispersion apparatus to form a heated gas comprising hydrogen radicals; and (e) exposing said silicon wafer to the heated gas comprising hydrogen radicals.

15. A method in accordance with claim 14, wherein during said exposing step (e) said silicon wafer is removably mounted to said wafer support and rotation driving mechanism.

16. The method in accordance with claim 14, wherein during said heating step (c) said mixed gas is heated to a temperature of 150° C.–300° C.

17. A method in accordance with claim 14, wherein said mix of gas comprises hydrogen in a range of 0.05%–5.0% by volume.

* * * * *